(12) United States Patent
Shigemori et al.

(10) Patent No.: US 7,541,849 B2
(45) Date of Patent: Jun. 2, 2009

(54) PHASE LOCKED CIRCUIT

(75) Inventors: Mikio Shigemori, Samukawa (JP); Masataka Nomura, Minowa (JP)

(73) Assignee: Seiko Epson Corporation (JP)

( * ) Notice: Subject to any disclaimer, the term of this patent is extended or adjusted under 35 U.S.C. 154(b) by 333 days.

(21) Appl. No.: 11/463,032

(22) Filed: Aug. 8, 2006

(65) Prior Publication Data
US 2008/0180143 A1 Jul. 31, 2008

(30) Foreign Application Priority Data
Aug. 9, 2005 (JP) ............................ 2005-230405
Sep. 28, 2005 (JP) ............................ 2005-282120

(51) Int. Cl.
*H03L 7/06* (2006.01)
(52) U.S. Cl. ........................ 327/156; 327/159
(58) Field of Classification Search .................. 327/156
See application file for complete search history.

(56) References Cited

U.S. PATENT DOCUMENTS 5,495,202 A * 2/1996 Hsu ........................... 327/113
5,568,098 A * 10/1996 Horie et al. .................. 327/156
5,781,600 A * 7/1998 Reeve et al. ................. 327/157
5,815,900 A * 10/1998 Ichikawa et al. ............ 29/25.35
5,973,570 A * 10/1999 Salvi et al. .................... 331/16
6,441,692 B1 * 8/2002 Nakatani et al. ............. 327/156

FOREIGN PATENT DOCUMENTS

| JP | 05-075377 | 3/1993 |
| JP | H09-237133 | 9/1997 |
| JP | 2002-305446 | 10/2002 |

* cited by examiner

*Primary Examiner*—Long Nguyen
(74) *Attorney, Agent, or Firm*—Harness, Dickey & Pierce, P.L.C.

(57) ABSTRACT

A phase locked circuit includes a locked loop circuit having a phase comparator, a voltage controlled oscillator, and a variable frequency divider which divides a clock signal $f_{vco}$ output from the voltage controlled oscillator by n and outputs it. Additionally, the phase locked circuit includes a band pass filter part which is coupled to an output side of the voltage controlled oscillator via a switching part. A frequency division ratio setting signal to be input into the variable frequency divider is input as a switching signal into the switching part so as to switch a frequency of the clock signal $f_{vco}$ output from the voltage controlled oscillator. As synchronizing with switching of the frequency, the switching part switches a plurality of band pass filters provided to the band pass filter part and couples to the voltage controlled oscillator.

6 Claims, 6 Drawing Sheets

PHASE LOCKED CIRCUIT

FIELD

The present teachings relate to a phase locked circuit, in particular, to PLL (Phase Locked Loop) circuit which oscillates to output a signal synchronized with a phase of a reference signal input from the outside.

BACKGROUND

A plurality of electronic apparatuses are often used coupled to each other. In addition, in a personal computer (PC) and the like, a function thereof is to couple a plurality of peripheral devices such as a printer, a display, a scanner, a hard disc drive, and the like thereto. In the electronic apparatuses and the peripheral devices, clock signals thereof, which operate these apparatuses and devices properly, are often different from each other. Therefore, an oscillator provided to a mother board outputs a plurality of clock signals having different frequencies in order that the peripheral devices coupled to the mother board of the electronic apparatus operate properly (see for example, Patent Document JP-A-9-237133). In a case where a plurality of clock signals having different frequencies are output as mentioned above, a clock signal output by one oscillator is frequency-transformed by PLL circuit.

A reference clock signal to be input into the peripheral devices coupled to the mother board often includes jitters due to an effect of a wiring of the mother board or noises from the outside.

Further, an input-output interface called a PCI express has become widespread in use recently. The PCI express outputs a 100 MHz reference clock signal obtained by spectrum spreading on a mother board, and apparatuses coupled to the mother board operate at 100 MHz or 125 MHz. Therefore, the PCI express needs to output 100 MHz or 125 MHz clock signals while corresponding to operating frequencies of electronic apparatuses coupled to the mother board. Accordingly, the PCI express needs a PLL circuit which can switch and output 100 MHz or 125 MHz.

SUMMARY

The PLL circuit, which is a phase locked circuit, inputs a signal obtained by comparing phases as a control signal, which controls a frequency of an output signal of a voltage controlled oscillator through removing a high frequency component by a loop filter, thereby causing noise A and noise B having frequencies unnecessary for an output signal of the PLL circuit, as shown in FIG. 6. FIGS. 6A and 6B show frequency (logarithmic expression) on the horizontal axes and electrical power on the vertical axes. FIG. 6A shows a case where an output signal is not spectrum spread and FIG. 6B shows a case where the output signal is spectrum spread. Both of them show schematically frequency bands which have a higher frequency than a center frequency fc of the output signal of the PLL circuit.

If the clock signal includes a signal component having a frequency which is out of the center frequency fc of the clock signal like above, the noise A and the noise B occur, thereby causing jitters of the clock signal. Therefore, in a case where the PLL circuit is used, such inconvenience arises that synchronization is not realized among electronic apparatuses, or electronic apparatuses malfunction. Additionally, it is to be difficult to spectrum spread the clock signal for avoiding EMI (Electro Magnetic Interference).

The present teachings are intended to solve above related art disadvantages and make it possible to output a signal which includes no jitters.

In addition, the present teachings are intended to make it possible to output selectively one of a plurality of signals having predetermined different frequencies without jitters.

The phase locked circuit according to the present teachings includes a locked loop circuit which has a phase comparator and a voltage controlled oscillator, and outputs an output signal of the voltage controlled oscillator. The phase comparator outputs a phase difference signal which corresponds to a phase difference between a reference signal input from the outside and a feedback signal based on the output signal of the voltage controlled oscillator. A frequency of the output signal of the voltage controlled oscillator is controlled on the basis of the phase difference signal, and at least one band pass filter is provided to an output side of the locked loop circuit.

Hence, a signal output from the voltage controlled oscillator is output via the band pass filter part, so that noise having unnecessary frequencies but a desired predetermined frequency can be removed from the output signal of the phase locked circuit. Consequently, a clock signal which has few jitters caused by noise can be output. Accordingly, a malfunction of an electronic apparatus can be prevented.

The locked loop circuit may further include a variable frequency divider. The variable frequency divider may output the feedback signal obtained through dividing the output signal of the voltage controlled oscillator by a frequency division ratio. The frequency division ratio may be changed on the basis of the switching signal for the output frequency coming from the outside. The locked loop circuit may output an output signal having one of a plurality of predetermined frequencies which are different from each other, on the basis of the switching signal for the output frequency. The band pass filter part may have a plurality of band pass filters corresponding to the plurality of predetermined frequencies which are different from each other. On the basis of the above switching signal, such a switching part are provided that couples the band pass filters corresponding to the frequencies of the output signal of the locked loop circuit to the voltage controlled oscillator, between the locked loop circuit and the band pass filter part. Accordingly, a plurality of predetermined signals which include no jitters can be output.

The output signal of the voltage controlled oscillator may be diffused in a predetermined frequency band. Accordingly, it can be applied to an electronic apparatus which spectrum spreads a clock signal for avoiding EMI. It is preferable that the band pass filter be a surface acoustic wave filter. Since the surface acoustic wave filter includes filter characteristics to attenuate rapidly a frequency which is outside of the passband, unnecessary noise can reliably be removed. In the surface acoustic wave filter, since a passband width is broad, an output signal is spectrum spread in a predetermined frequency band. Even in a case where the frequency band is broad, noise existing outside of the frequency band can be removed.

The band pass filter may be a surface acoustic wave filter used quartz crystal as a piezoelectric material. The surface acoustic wave filter used quartz crystal as a piezoelectric material has superior characteristics to rapidly attenuate electrical power in frequency regions on both sides of the passband, so that noise is reliably removed. In addition, since the surface acoustic wave filter used quartz crystal as a piezoelectric material can be formed small in size, the phase locked circuit can be miniaturized.

It is preferable that an amplifier be provided to an output side of the band pass filter part. Since RC filter or a surface acoustic wave filter composed of passive parts such as a resistor, a capacitor, and the like is a passive filter, a clock signal output from the voltage controlled oscillator attenuates. Therefore, an amplifier is provided to an output side of the band pass filter in order that the clock signal is amplified and output, thereby the clock signal which receives no affections of outside noises and the like can be output.

BRIEF DESCRIPTION OF THE DRAWINGS

FIG. 3A is an explanatory graphic of a case without being spectrum spread, and FIG. 3B is an explanatory graphic of a case with being spectrum spread;

FIG. 6A is an explanatory graphic of a case without being spectrum spread, and FIG. 6B is an explanatory graphic of a case with being spectrum spread.

DETAILED DESCRIPTION

A preferred configuration of a phase locked circuit according to the present teachings will now be described in detail with reference to the accompanying drawings.

Figure 1:
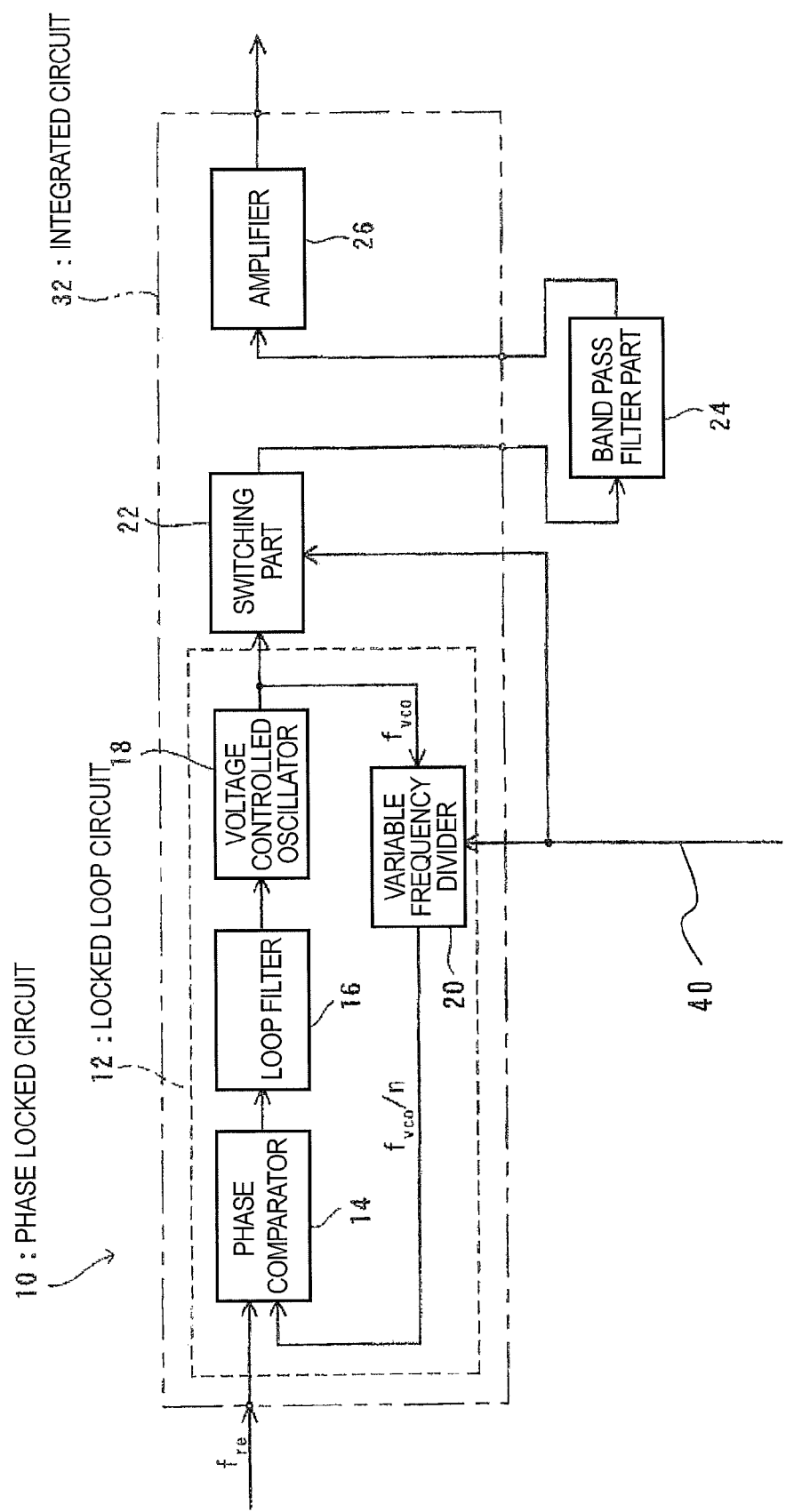
FIG. 1 is a block diagram of a phase locked circuit.

FIG. 1 is a block diagram of a phase locked circuit according to a configuration of the present teachings. In FIG. 1, a phase locked circuit 10 includes a locked loop circuit 12 constituting a PLL. The locked loop circuit 12 is composed of a phase comparator 14, a loop filter 16, a voltage controlled oscillator 18, and a variable frequency divider 20. In the phase comparator 14, a reference signal (a reference clock signal) fre is input into one input terminal thereof from the outside. A feedback signal which is an output signal of the variable frequency divider 20 is input into the other input terminal of the phase comparator 14.

The variable frequency divider 20 whose input terminal is coupled with an output terminal of the voltage controlled oscillator 18 outputs a feedback signal ($f_{vco}/n$) which is obtained by dividing the output signal (clock signal) $f_{vco}$ of the voltage controlled oscillator 18 by n. Then, the phase comparator 14 compares phases of the reference clock signal fre input from the outside and the feedback signal $f_{vco}/n$ output from the variable frequency divider 20, and inputs a phase difference signal corresponding to their phase difference into the loop filter 16. The loop filter 16 made of a low-pass filter that removes high frequency components of the output signal of the phase comparator 14, and inputs a direct current control voltage into the voltage controlled oscillator 18.

The voltage controlled oscillator 18 can change an oscillation frequency of the signal output by the control voltage input from the loop filter 16. The output clock signal $f_{vco}$ of the voltage controlled oscillator 18 is input into the variable frequency divider 20 to be divided by n, and then given to the phase comparator 14. In the variable frequency divider 20, a frequency division ratio n is variable and is set by a switching signal 40 for an output frequency, input from the outside.

The phase locked circuit 10 further includes a switching part 22, a band pass filter part 24, and an amplifier 26. The switching part 22 is formed of a plurality of switching elements such as a transistor and the like, is provided to an output side of the voltage controlled oscillator 18, and is input the clock signal $f_{vco}$ output from the voltage controlled oscillator 18. Further, the switching part 22 is input a switching signal 40 for an output frequency, given to the variable frequency divider 20.

Figure 2:
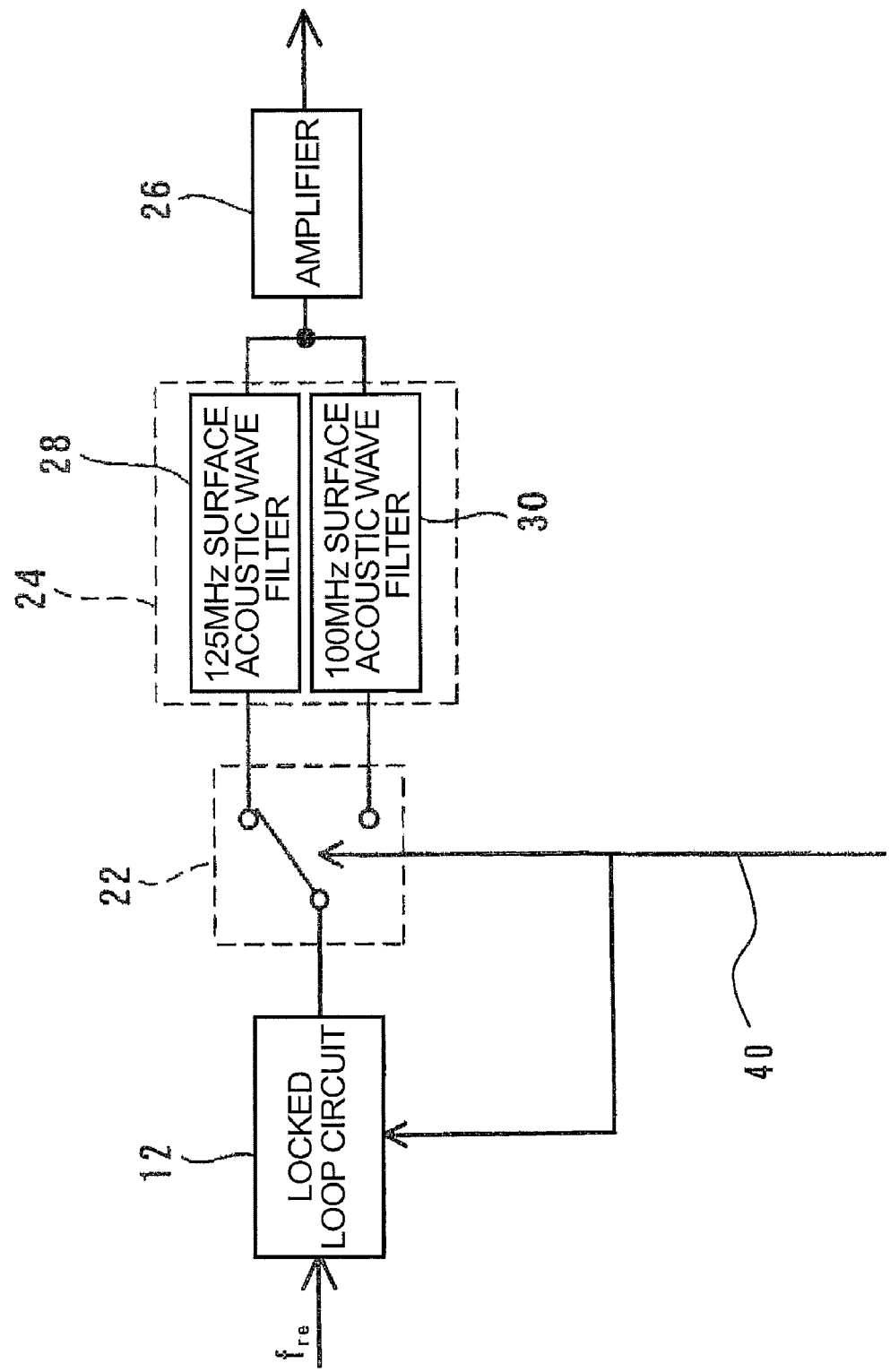
FIG. 2 is an explanatory diagram showing a switching part and a band pass filter part in detail.

The band pass filter part 24 is composed of a plurality of band pass filters, an input side thereof is coupled to the switching part 22, and an output side thereof is coupled to the amplifier 26. The band pass filter part 24, in the configuration, is composed of a band pass filter 28 which is a band pass type filter having 125 MHz center frequency, and a band pass filter 30 which is a band pass type filter having 100 MHz center frequency, as shown in FIG. 2. These band pass filters 28 and 30 are made of surface acoustic wave (SAW) filters that use quartz crystal as a piezoelectric material. Each of the band pass filters 28 and 30 in the band pass filter part 24 is switched to be coupled to the voltage controlled oscillator 18 by the switching part 22. Specifically, the switching part 22 synchronizes with an output signal of the locked loop circuit 12, that is, a frequency switching signal, for an output signal of the voltage controlled oscillator 18 so as to switch and couple the band pass filters 28 and 30 to the voltage controlled oscillator 18.

The amplifier 26, which is an output part of the phase locked circuit 10, amplifies the clock signal $f_{vco}$, which is output from the voltage controlled oscillator 18 and passes through the band pass filter part 24, and output it to the outside. The phase locked circuit 10, as shown with the two-dot chain line in FIG. 1, is formed as a semiconductor integrated circuit 32 composed of the locked loop circuit 12, the switching part 22, and the amplifier 26, that is, as one tip. The band pass filter part 24 is attached externally to the semiconductor integrated circuit 32.

In a case where, for example, the phase locked circuit 10 makes the voltage controlled oscillator 18 output 100 MHz clock signal $f_{vco}$, it inputs the switching signal 40 which sets a predetermined frequency division ratio n for the output frequency, into the variable frequency divider 20. The switching signal 40 for the output frequency is input into the switching part 22 as a switching signal at the same time. If the switching part 22 inputs the switching signal 40 for the output frequency for outputting 100 MHz, as a switching signal, it couples the band pass filter 30 whose center frequency is 100 MHz in the band pass filter part 24 to the voltage controlled oscillator 18 by driving the switching element. A part of the clock signal $f_{vco}$ output from the voltage controlled oscillator 18 is input into the variable frequency divider 20, divided by n, and input into the phase comparator 14. The 100 MHz clock signal $f_{vco}$ output from the voltage controlled oscillator 18 is input into the band pass filter part 24 via the switching part 22. Then, the 100 MHz clock signal passes through the band pass filter 30 which is coupled to the voltage controlled oscillator 18 and the center frequency is 100 MHz, is amplified by the amplifier 26, and is output to the outside.

Figure 3A:
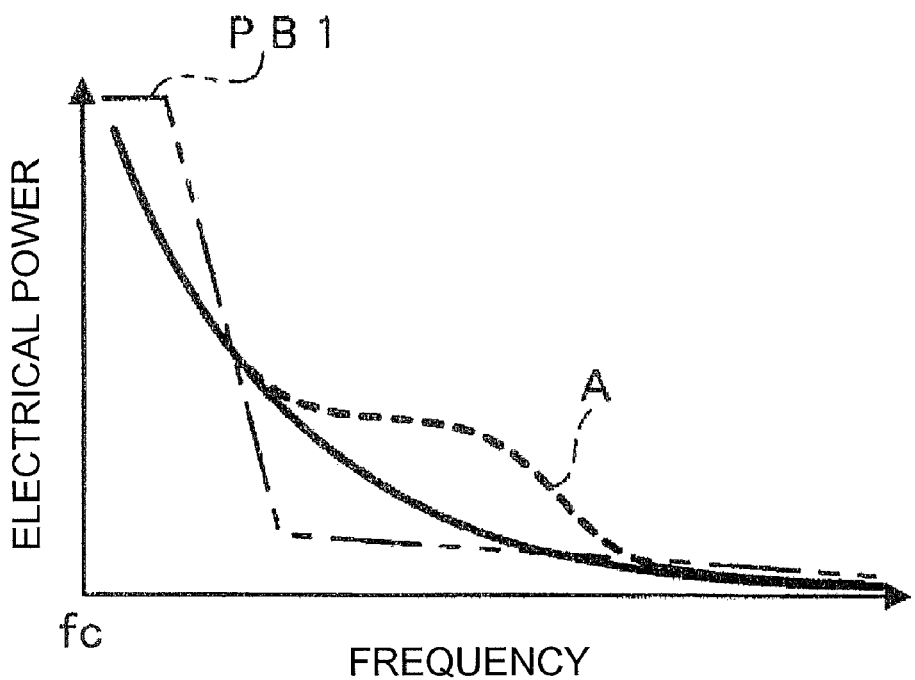
FIGS. 3A and 3B are graphics describing effects of an embodiment where

In addition, for the band pass filters 28 and 30, in a case where the output clock signal $f_{vco}$ of the voltage controlled oscillator 18 is not spectrum spread, a narrow band pass filter whose passband is narrow is used. Specifically, in a case where the reference clock signal fre being input is not spectrum spread and the output clock signal of the voltage controlled oscillator 18 is not spectrum spread on the locked loop circuit 12, narrow band-pass filters having a passband PB1 shown with two-dot chain line in FIG. 3A is used for the band pass filters 28 and 30 in the band pass filter part 24. Accordingly, the frequency passing through the band pass filter 30 becomes as a solid line in FIG. 3B and noise A existing before the frequency passes through the band pass filter 30 can be removed. Consequently, the clock signal output from the amplifier 26 can be a clock signal which includes no jitters.

In addition, in the embodiment, since the band pass filters 28 and 30 are made of surface acoustic wave filters, electrical power in the frequency regions on both sides of the passband can be attenuated rapidly, thereby being able to prevent occurrence of jitters of the clock signal, and the like. Moreover, in the embodiment, since the band pass filters 28 and 30 are surface acoustic wave filters that use quartz crystal as a piezoelectric material, they have superior characteristics to attenuate electrical power (signal strength) in the frequency regions on both sides of the passband rapidly, compared to other piezoelectric materials. Furthermore, if the band pass filters 28 and 30 are the surface acoustic wave filters that use quartz crystal, the band pass filters 28 and 30 are small in size, so that the phase locked circuit 10 can be miniaturized. Further, since the clock signal after passing through the band pass filters is amplified by the amplifier 26, even where the clock signal $f_{vco}$ passes through the band pass filters 28 and 30 and attenuates, it is amplified by the amplifier 26. Consequently, the clock signal which is not affected by noises and the like can be output.

Figure 3B:
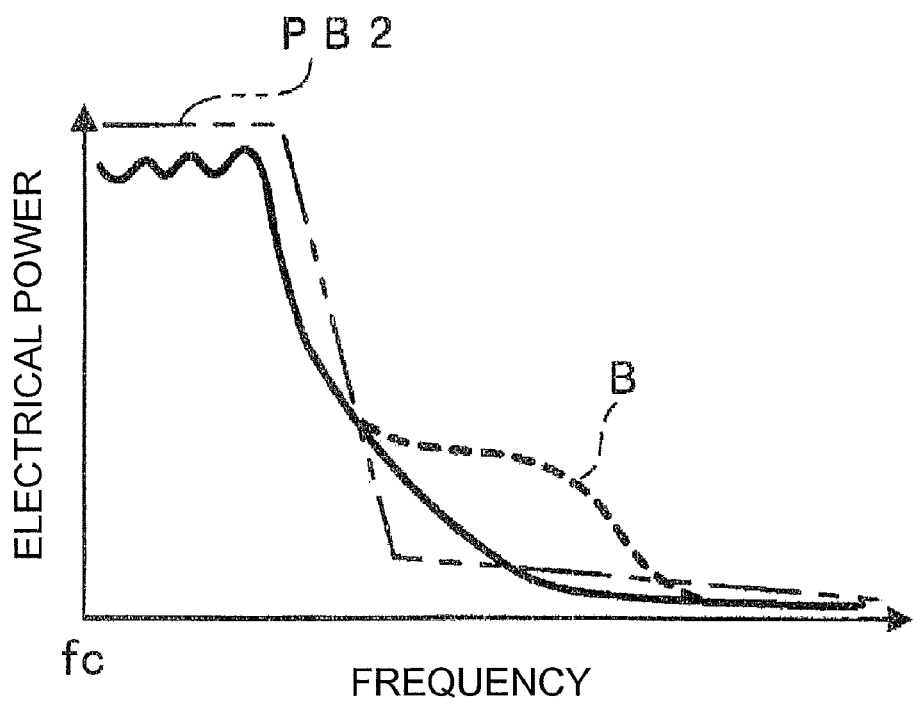

On the other hand, in a case where the clock signal output from the voltage controlled oscillator 18 is spectrum spread, a wide band pass filter whose passband is wide is used. In particular, in a case where the reference clock signal fre being input is spectrum spread, or a case where the output clock signal $f_{vco}$ of the voltage controlled oscillator 18 is spectrum spread and output, such wide band pass filters as shown with two-dot chain line PB2 in FIG. 3B is used. Accordingly, as shown with a solid line in FIG. 3B, the clock signal which is spectrum spread in a wide passband is enabled to pass through. Further, as shown with a dotted line in FIG. 3B, noise B can be removed and thereby the clock signal which includes no jitters can be output. In addition, the band pass filters can be surface acoustic wave filters having a passband width of which one side is about 2% with respect to the center frequency fc, thereby being able to spectrum spread in a wide frequency band. Consequently, the phase locked circuit 10 can correspond to an electronic apparatus using a clock signal spectrum spread for avoiding EMI.

In the above configuration, a case where a frequency of the output signal of the phase locked circuit 10 is 100 MHz is described, but it is the same as a case where it is 125 MHz. In the above configuration, a case where 100 MHz clock signal and 125 MHz clock signal are switched and output is described, but it is possible to output three or more signals having different frequencies. In this case, the band pass filter part 24 is provided with a band pass filter which corresponds to each frequency. In the above configuration, a case where the surface acoustic wave filters are used as band pass filters is described, but an LC filter, an active filter, or the like can be used.

Figure 4:
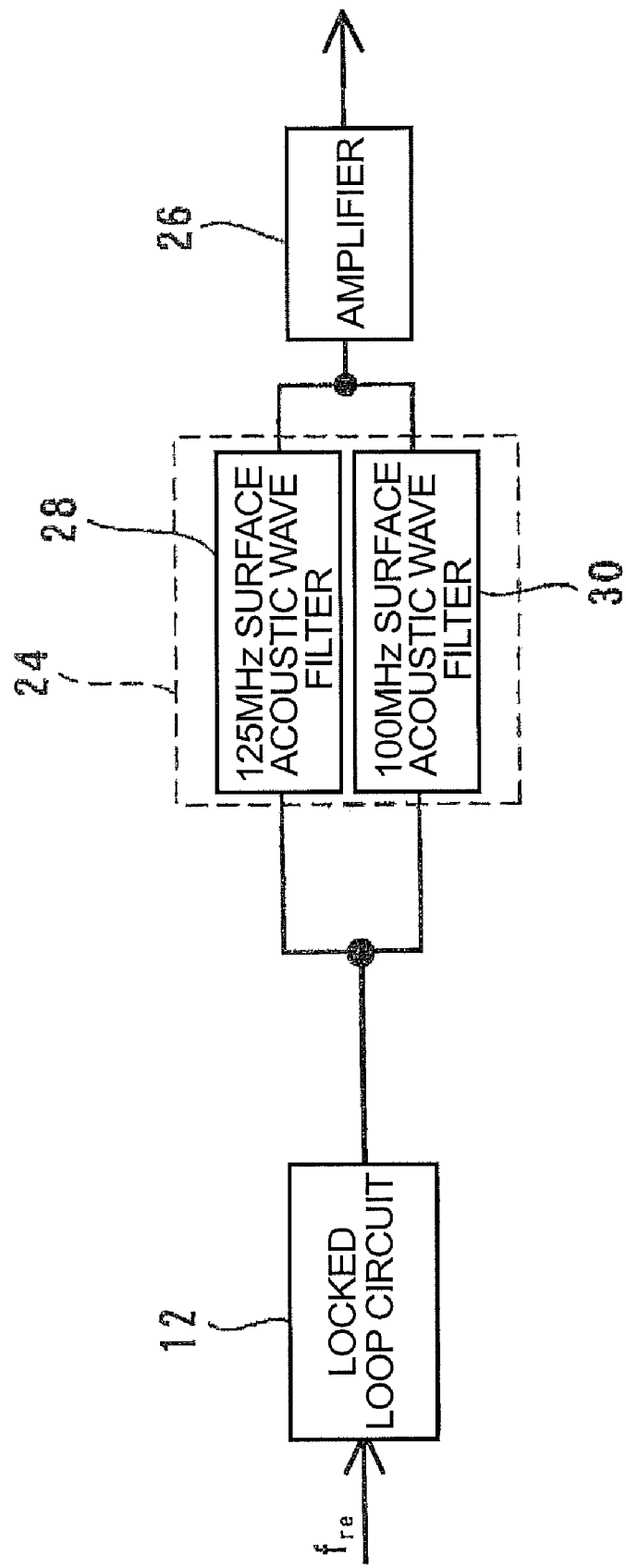
FIG. 4 is a diagram describing a part of a phase locked circuit according to a modification example.

FIG. 4 is an explanatory diagram of a modification example of a phase locked circuit according to the present invention. The locked loop circuit 12 is coupled with the plurality of band pass filters 28 and 30 in parallel. An output signal of the locked loop circuit 12 is directly input into the plurality of band pass filters 28 and 30. In a case where a frequency of the output signal of the locked loop circuit 12 is 125 MHz, noise is removed at the 125 MHz band pass filter 28 and thereby a signal which has few jitters is output. In this case, 125 MHz signal is input also into the band pass filter 30 whose center frequency is 100 MHz, but 125 MHz signal can not pass through the 100 MHz band pass filter 30 whose center frequency is 100 MHz. Therefore, if a plurality of surface acoustic wave filters are coupled to the locked loop circuit 12 in parallel, a filtering process for a plurality of frequencies can be performed even without providing a switching part. In particular, according to the modification example of the phase locked circuit, without any necessity to switch connections between the locked loop circuit 12 and the plurality of surface acoustic wave filters on the basis of the switching signal, jitters can be removed from the output signal of the phase locked circuit in a simple composition.

Figure 5:
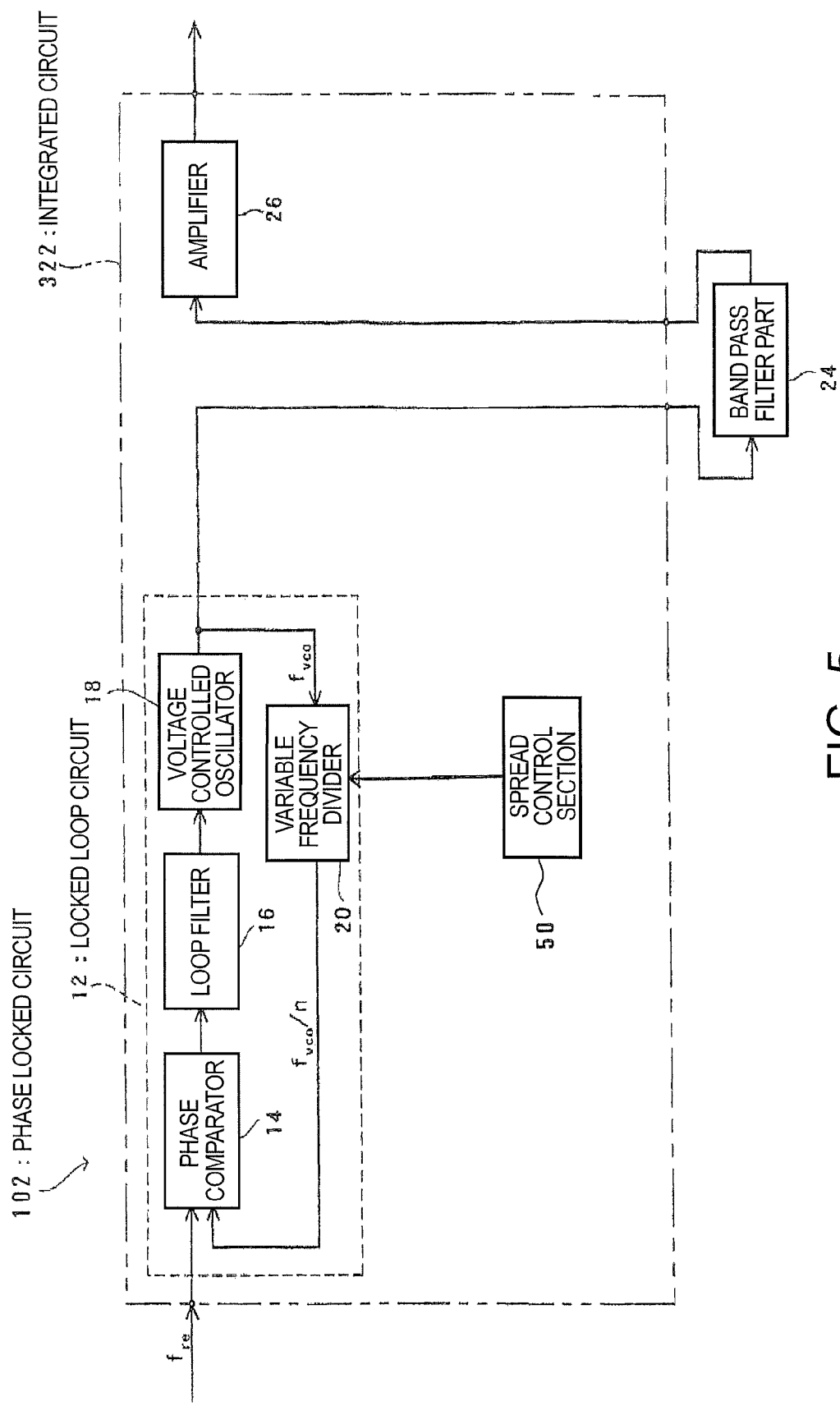
FIG. 5 is a block diagram of a phase locked circuit which has a spectrum spread function.
Figure 6A:
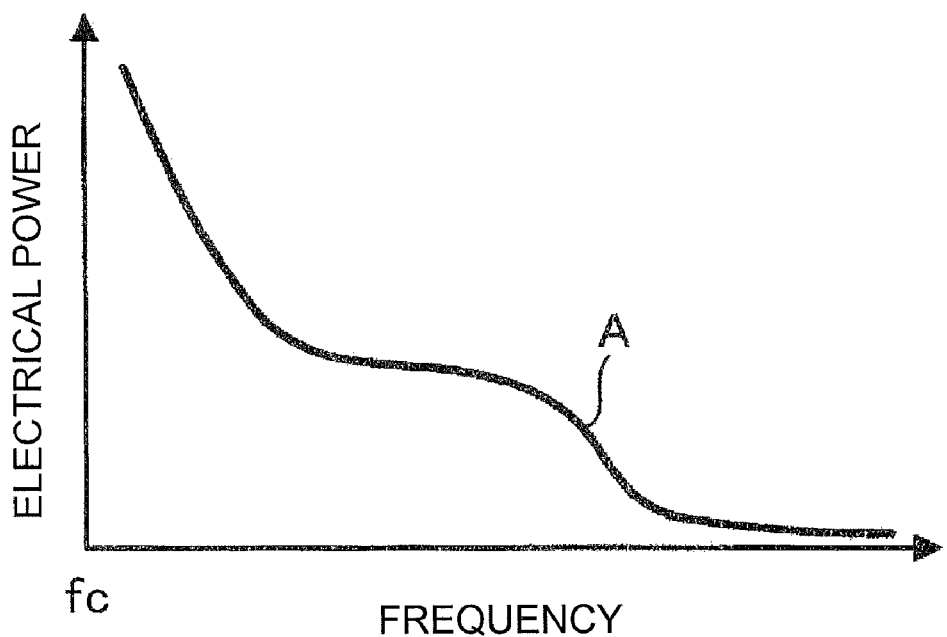
FIGS. 6A and 6B are graphics describing characteristics of frequencies output from related art PLL circuit where
Figure 6B:
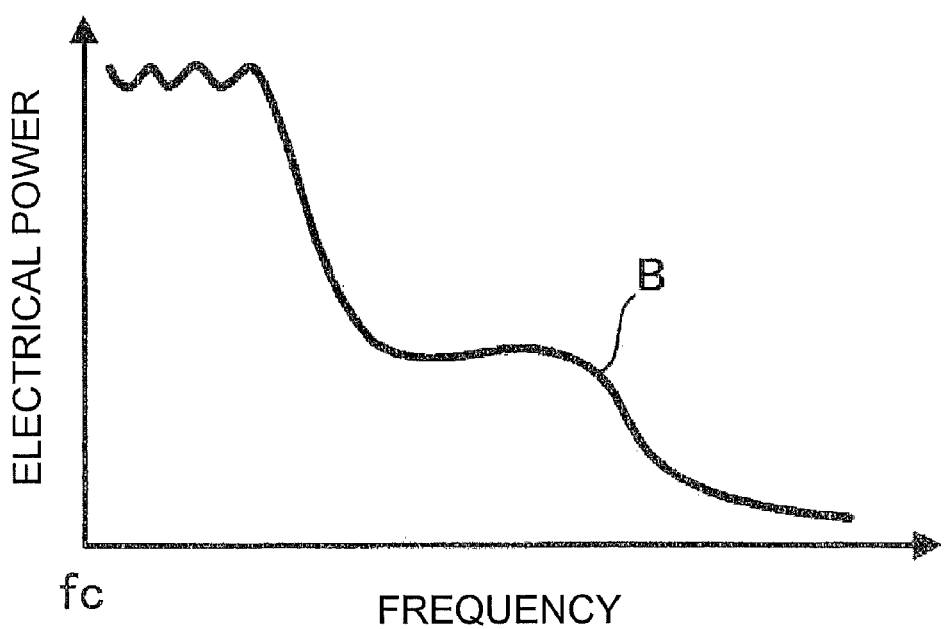

FIG. 5 is a block diagram of another modification example of a phase locked circuit according to the present invention. A phase locked circuit 102 includes a function to output a spectrum spread signal. A spread control section 50 is coupled to the variable frequency divider 20 and controls a frequency division ratio of the variable frequency divider 20. In particular, in order to periodically change a frequency of a clock signal output from the voltage controlled oscillator 18, the spread control section 50 memorizes a plurality of frequency division ratios of the variable frequency divider 20 in an internal memory part thereof. The plurality of frequency division ratios are sequentially output to the variable frequency divider 20 as time advances so that a frequency division ratio is set. The variable frequency divider 20 divides an output signal of the voltage controlled oscillator 18 on the basis of the frequency division ratio set by the spread control section 50. Then, the variable frequency divider 20 outputs the divided signal to the phase comparator 14. Therefore, a phase difference between a feedback signal input into the phase comparator 14 from the variable frequency divider 20 and a reference signal fre changes as time advances. Consequently, a phase difference signal output from the phase comparator 14 changes periodically. Accordingly, a frequency control voltage to be input into the voltage controlled oscillator 18 from the loop filter 16 changes periodically, and thereby a frequency of the output signal of the voltage controlled oscillator 18 changes periodically within a scope of a predetermined frequency range centering the frequency of the reference signal fre. Consequently, a frequency of the output signal of the locked loop circuit 12 is diffused.

The output signal of the locked loop circuit 12 in FIG. 5 is input into the band pass filter part 24. The band pass filter part 24 is formed to attenuate a signal which passes through a diffused frequency band and stays at a frequency band which is outside of the diffused frequency band. As a specific composition of the band pass filter part 24, as shown in FIG. 4, such a composition that a plurality of surface acoustic wave filters are coupled in parallel to an output side of the locked loop circuit 12 can be used. In another way, as shown in FIG. 2, the switching part 22 may be provided between the output side of the locked loop circuit 12 and the band bass filter part 24 so as to switch connections between the locked loop circuit 12 and the plurality of band pass filters 28 and 30.

In a signal passing through the band pass filter part 24, noise is removed. In the present configuration, the band pass filter 24 is made of at least one surface acoustic wave filter, so that it can attenuate frequencies on both sides of the passband, and thereby is able to prevent occurrence of jitters on an output signal of the phase locked circuit. The surface acoustic wave filter can be a filter having a passband width of which one side is about 2% with respect to the center frequency. This passband width is relatively broad, preventing the spectrum spread signal from causing jitters.

The entire disclosure of Japanese Patent Application Nos. 2005-230405 m filed Aug. 9, 2005 and 2005-282120, filed Sep. 28, 2005 are expressly incorporated by reference herein.

The invention claimed is:

1. A phase locked circuit, comprising;
   a locked loop circuit including a phase comparator and a voltage controlled oscillator,
   wherein the locked loop circuit outputs an output signal of the voltage controlled oscillator, and
   wherein the phase comparator outputs a phase difference signal which corresponds to a phase difference between a reference signal input from an outside and a feedback signal based on the output signal of the voltage controlled oscillator,
   a frequency of the output signal of the voltage controlled oscillator is controlled on the basis of the phase difference signal, and
   at least one band pass filter part is provided to an output side of the locked loop circuit,
   wherein the locked loop circuit further includes a variable frequency divider, and wherein the variable frequency divider outputs the feedback signal obtained through dividing the output signal of the voltage controlled oscillator by a frequency division ratio which is changed on the basis of a switching signal for an output frequency, the switching signal coming from the outside, the locked loop circuit outputs the output signal having one of a plurality of mutually different frequencies predetermined on the basis of the switching signal for the output frequency,
   wherein the at least one band pass filter part has a plurality of band pass filters which correspond to the plurality of predetermined frequencies which are different from each other, and
   wherein a switching part which couples one of the plurality of band pass filters corresponding to the frequency of the output signal of the locked loop circuit to the voltage controlled oscillator is provided between the locked loop circuit and the at least one band pass filter part.

2. The phase locked circuit according to claim 1, wherein the output signal of the voltage controlled oscillator is diffused in a predetermined frequency band.

3. The phase locked circuit according to claim 1, wherein the at least one band pass filter part is a surface acoustic wave filter.

4. The phase locked circuit according to claim 1, wherein the at least one band pass filter part is a surface acoustic wave filter having quartz crystal as a piezoelectric material.

5. The phase locked circuit according to claim 1, wherein an amplifier is provided to an output side of the at least one band pass filter part.

6. A phase locked circuit, comprising;
   a locked loop circuit including a phase comparator and a voltage controlled oscillator,
   wherein the locked loop circuit outputs an output signal of the voltage controlled oscillator, and
   wherein the phase comparator outputs a phase difference signal which corresponds to a phase difference between a reference signal input from an outside and a feedback signal based on the output signal of the voltage controlled oscillator,
   a frequency of the output signal of the voltage controlled oscillator is controlled on the basis of the phase difference signal, and
   a plurality of band pass filters provided to an output side of the locked loop circuit,
   wherein the plurality of bandpass filters are connected in parallel relative to each other and between the locked loop circuit and an amplifier of the phase locked circuit, and
   wherein each of the plurality of bandpass filters filter the output signal of the voltage controlled oscillator.

* * * * *